United States Patent
Wang et al.

(10) Patent No.: US 9,704,930 B2
(45) Date of Patent: Jul. 11, 2017

(54) OLED DISPLAY PANEL AND FABRICATION METHOD THEREOF, AND DISPLAY DEVICE

(71) Applicant: BOE TECHNOLOGY GROUP CO., LTD., Beijing (CN)

(72) Inventors: Chun Jan Wang, Beijing (CN); Chang Yen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 14/437,164

(22) PCT Filed: Sep. 26, 2014

(86) PCT No.: PCT/CN2014/087580
§ 371 (c)(1),
(2) Date: Apr. 20, 2015

(87) PCT Pub. No.: WO2015/169040
PCT Pub. Date: Nov. 12, 2015

(65) Prior Publication Data
US 2016/0300888 A1    Oct. 13, 2016

(30) Foreign Application Priority Data

May 9, 2014 (CN) .......................... 2014 1 0196115

(51) Int. Cl.
*H01L 27/32* (2006.01)
*H01L 51/56* (2006.01)
*H01L 51/52* (2006.01)

(52) U.S. Cl.
CPC ........ *H01L 27/322* (2013.01); *H01L 27/3213* (2013.01); *H01L 51/56* (2013.01);
(Continued)

(58) Field of Classification Search
CPC ................................................ H01L 2227/323
See application file for complete search history.

(56) References Cited

U.S. PATENT DOCUMENTS 7,538,354 B2 *  5/2009  Hayashi .............. H01L 51/5253
                                                           257/40
8,294,143 B2 * 10/2012  Imai ...................... H01L 27/322
                                                           257/40
(Continued)

FOREIGN PATENT DOCUMENTS

CN        101452948 A       6/2009
CN        102593371 A       7/2012
(Continued)

OTHER PUBLICATIONS

Dec. 29, 2015—(CN)—Fourth Office Action Appn 201410196115.2 with English Tran.
(Continued)

*Primary Examiner* — Caridad Everhart
*Assistant Examiner* — Ankush Singal
(74) *Attorney, Agent, or Firm* — Banner & Witcoff, Ltd (57) ABSTRACT

An OLED display panel and a fabrication method thereof, and a display device are disclosed. The OLED display panel comprises: an array substrate and a package cover plate disposed opposite to each other, and an OLED layer which is formed on a surface of the array substrate facing the package cover plate and comprises a plurality of OLEDs. The OLED display panel further comprises: a first thin film packaging layer, covering the OLED layer and bonded to the array substrate; a color filter layer, provided on a side of the first thin film packaging layer facing the package cover plate; and a bonding adhesive, filled between the array substrate and the package cover plate to bond the array substrate and the package cover plate, the bonding adhesive covering the color filter layer and the first thin film packaging layer.

19 Claims, 3 Drawing Sheets

(52) U.S. Cl.
CPC ...... *H01L 27/3244* (2013.01); *H01L 51/5246* (2013.01); *H01L 51/5253* (2013.01); *H01L 51/5284* (2013.01); *H01L 2227/323* (2013.01); *H01L 2251/5315* (2013.01)

(56) References Cited

U.S. PATENT DOCUMENTS

| | | | |
|---|---|---|---|
| 8,680,766 B2* | 3/2014 | Matsuzaki | H01L 51/524 313/504 |
| 9,431,463 B2* | 8/2016 | Choi | H01L 27/322 |
| 2004/0195963 A1* | 10/2004 | Choi | H01L 27/3213 313/504 |
| 2005/0068474 A1 | 3/2005 | Su | |
| 2005/0093434 A1* | 5/2005 | Suh | H01L 27/322 313/504 |
| 2005/0093435 A1* | 5/2005 | Suh | H01L 27/322 313/504 |
| 2007/0200492 A1* | 8/2007 | Cok | H01L 27/322 313/506 |
| 2007/0278940 A1* | 12/2007 | Nshikawa | H01L 27/3211 313/504 |
| 2009/0051284 A1* | 2/2009 | Cok | H01L 27/3213 313/506 |
| 2009/0066236 A1* | 3/2009 | Sung | H01L 27/3279 313/504 |
| 2009/0091238 A1* | 4/2009 | Cok | H01L 51/5265 313/498 |
| 2010/0019654 A1* | 1/2010 | Hayashi | H01L 51/5256 313/498 |
| 2010/0102320 A1* | 4/2010 | Chung | H01L 27/1214 257/59 |
| 2010/0232162 A1 | 9/2010 | Shin et al. | |
| 2011/0309389 A1* | 12/2011 | Yu | H01L 27/322 257/89 |
| 2012/0267611 A1 | 10/2012 | Chung et al. | |
| 2013/0153870 A1* | 6/2013 | Seo | H01L 51/5262 257/40 |
| 2013/0313530 A1* | 11/2013 | Seo | H01L 29/66969 257/40 |
| 2014/0027724 A1* | 1/2014 | Lim | H01L 51/5281 257/40 |
| 2014/0117324 A1* | 5/2014 | Kim | H01L 27/323 257/40 |
| 2014/0138630 A1* | 5/2014 | Lee | H01L 51/5253 257/40 |
| 2014/0183471 A1* | 7/2014 | Heo | H01L 27/322 257/40 |
| 2014/0183478 A1* | 7/2014 | Lee | H01L 51/56 257/40 |
| 2014/0184972 A1* | 7/2014 | Park | G02F 1/133514 349/43 |
| 2014/0191215 A1* | 7/2014 | Tojo | H01L 27/322 257/40 |
| 2014/0273319 A1* | 9/2014 | Shieh | H01L 27/322 438/27 |
| 2014/0346477 A1* | 11/2014 | Chao | H01L 51/0024 257/40 |
| 2015/0188095 A1* | 7/2015 | Yoo | H01L 51/5284 257/40 |
| 2015/0362795 A1* | 12/2015 | Chen | G02F 1/133514 349/42 |
| 2016/0149151 A1* | 5/2016 | Kam | H01L 51/504 257/40 |
| 2016/0149164 A1* | 5/2016 | Lee | H01L 51/5281 257/40 |
| 2016/0254483 A1* | 9/2016 | Wang | H01L 51/5256 257/40 |
| 2016/0260788 A1* | 9/2016 | Fang | H01L 27/322 |

FOREIGN PATENT DOCUMENTS

| | | |
|---|---|---|
| CN | 103000638 A | 3/2013 |
| CN | 103107180 A | 5/2013 |
| CN | 103187434 A | 7/2013 |
| CN | 103348766 A | 10/2013 |
| CN | 103681733 A | 3/2014 |
| CN | 103996696 A | 8/2014 |
| CN | 203826395 U | 9/2014 |

OTHER PUBLICATIONS

Feb. 13, 2015—International Search Report for Appn PCT/CN2014/087580 with Eng Tran of Written Opinion.
Jan. 14, 2015—(CN)—First Office Action for Appn 201410196115.2 with Eng Tran.
Apr. 29, 2015—(CN)—Second Office Action for Appn 201410196115.2 with Eng Tran.
Sep. 16, 2015—(CN)—Third Office Action Appn. 201410196115.2 with Eng Tran.
Apr. 28, 2016—(CN)—Fifth Office Action Appn 201410196115.2 with English Tran.

* cited by examiner

OLED DISPLAY PANEL AND FABRICATION METHOD THEREOF, AND DISPLAY DEVICE

The application is a U.S. National Phase Entry of International Application No. PCT/CN2014/087580 filed on Sep. 26, 2014, designating the United States of America and claiming priority to Chinese Patent Application No. 201410196115.2 filed on May 9, 2014. The present application claims priority to and the benefit of the above-identified applications and the above-identified applications are incorporated by reference herein in their entirety.

TECHNICAL FIELD

Embodiments of the disclosure relate to an OLED display panel and a fabrication method thereof, and a display device.

BACKGROUND

As compared with a conventional liquid crystal display panel, an Organic Light Emitting Diode (OLED) display panel has gradually become a mainstream of new generation of flat panel display devices, due to its advantages such as quick response, wide color gamut, ultra-thinness, self-luminescent property, suitable for flexible application and so on.

Figure 1:
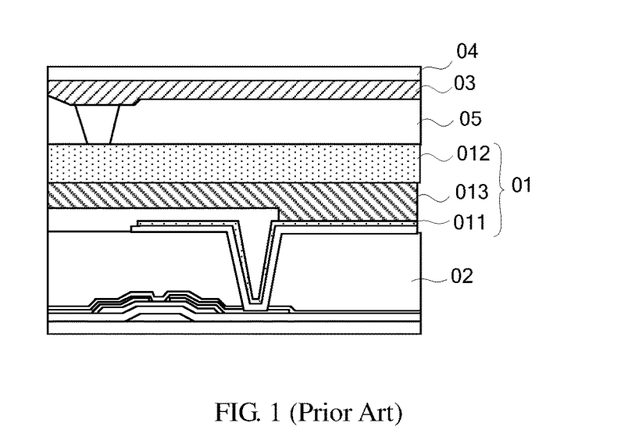
FIG. 1 is a structural schematic view illustrating an OLED display panel in the prior art.

In order to achieve full-color display of the OLED display panel, a top-emission type White Organic Light Emitting Diode (WOLED) and a Color Filter (CF) layer overlapped on the WOLED are generally employed. Overlapping the color filter layer on a WOLED layer having a plurality of WOLEDs can achieve a high resolution of the OLED display without a masking process using a high-precision metal mask. As shown in FIG. 1, after a thin film transistor (TFT) array substrate 02 comprising the WOLED layer 01 and a package cover plate 04 comprising the color filter layer 03 are respectively formed, a transparent adhesive 05 is provided on a surface of the WOLED layer 01 away from the array substrate 02, then a surface of the package cover plate 04 on which the color filter layer 03 is formed faces the WOLED layer 01, and finally the package cover plate 04 is aligned with and bonded to the array substrate 02 to form the OLED display panel.

However, in the OLED display panel in which the color filter layer 03 is overlapped on the top-emission WOLED layer 01 as shown in FIG. 1, after the package cover plate 04 is bonded with the array substrate 02, the transparent adhesive 05 having a relatively large thickness is provided between the color filter layer 03 and the WOLED layer 01, resulting in a relatively great distance between the color filter layer 03 and the WOLED layer 01; and in this case, because of a self-luminescent property of the WOLED layer 01, when light emitted from a region of the WOLED layer 01 corresponding to a sub-pixel unit of the display panel laterally arrives at the color filter 03, the light may pass through the transparent adhesive 05 to reach color filters of other sub-pixel units. Thus, a color mixture and a color aberration under large viewing angle occur in the OLED display panel; thereby a display effect of the OLED display panel is decreased.

SUMMARY

According to the embodiments of the present disclosure, there is provided an OLED display panel. The OLED display panel comprises: an array substrate and a package cover plate disposed opposite to each other, and an OLED layer which is formed on a surface of the array substrate facing the package cover plate and comprises a plurality of OLEDs. The OLED display panel further comprises: a first thin film packaging layer, covering the OLED layer and bonded to the array substrate; a color filter layer, provided on a side of the first thin film packaging layer facing the package cover plate; and a bonding adhesive, filled between the array substrate and the package cover plate to bond the array substrate and the package cover plate, the bonding adhesive covering the color filter layer and the first thin film packaging layer.

For example, the OLED display panel further comprises: a second thin film packaging layer which is provided between the bonding adhesive and the color filter layer.

For example, the color filter layer comprises a plurality of monochromatic color filter units corresponding to sub-pixel units of the display panel one by one.

For example, the OLED layer is a WOLED layer comprising a plurality of white organic light emitting diodes (WOLEDs); and any two adjacent monochromatic color filter units in the color filter layer are different in color.

For example, the plurality of monochromatic color filter units in the color filter layer comprises a red color filter unit R, a green color filter unit G, a white color filter unit W and a blue color filter unit B; and surfaces of the plurality of monochromatic color filter units in the color filter layer away from the array substrate are provided in a same plane.

For example, one red color filter unit R, one green color filter unit G, one white color filter unit W and one blue color filter unit B form a pixel unit; in a same pixel unit, any two adjacent monochromatic color filter units are in contact with each other or a black matrix is disposed between any two adjacent monochromatic color filter units.

For example, the plurality of monochromatic color filter units in the color filter layer comprises a red color filter unit R, a green color filter unit G and a blue color filter unit B; one red color filter unit R, one green color filter unit G and one blue color filter unit B form a pixel unit; and any two adjacent monochromatic color filter units in a same pixel unit are in contact with each other and are partially overlapped with each other.

For example, the plurality of monochromatic color filter units in the color filter layer comprises a red color filter unit R, a green color filter unit G and a blue color filter unit B; one red color filter unit R, one green color filter unit G and one blue color filter unit B form a pixel unit; and the monochromatic color filter units in a same pixel unit are not in contact with each other, and projections of any two adjacent monochromatic color filter units on the array substrate have an overlapping region.

For example, among the plurality of monochromatic color filter units of the same pixel unit, a surface of each monochromatic filter unit facing the array substrate and a surface of its adjacent monochromatic filter unit facing the array substrate are not provided in a same plane.

For example, the first thin film packaging layer and the second thin film packaging layer are seamlessly connected with each other to form an integral thin film packaging layer.

For example, the first thin film packaging layer and the second thin film packaging layer are made of silicon nitride, silicon oxide or silicon oxynitride.

For example, the bonding adhesive is a dam adhesive, a filling adhesive, a face sealing, an optically clear adhesive (OCA) or an optically clear resin (OCR).

For example, the first thin film packaging layer is of a single-layer structure or a multilayer structure.

For example, the second thin film packaging layer is of a single-layer structure or a multilayer structure.

According to the embodiments of the present disclosure, there is provided a display device. The display device comprises the OLED display panel as described above.

According to the embodiments of the present disclosure, there is provided a fabrication method of the OLED display panel as described above. The method comprises: forming the OLED layer having the plurality of organic light emitting diodes (OLEDs) on the array substrate; forming the first thin film packaging layer on the OLED layer; forming the color filter layer on the first thin film packaging layer; filling a bonding adhesive; bonding the package cover plate to the bonding adhesive.

For example, the color filter layer comprises a plurality of monochromatic color filter units corresponding to sub-pixel units of the display panel one by one, and the plurality of the monochromatic color filter units are formed on the thin film packaging layer by thermal evaporation, interference filter coating or laser transfer coating.

DESCRIPTION OF THE EMBODIMENTS

The technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 2:
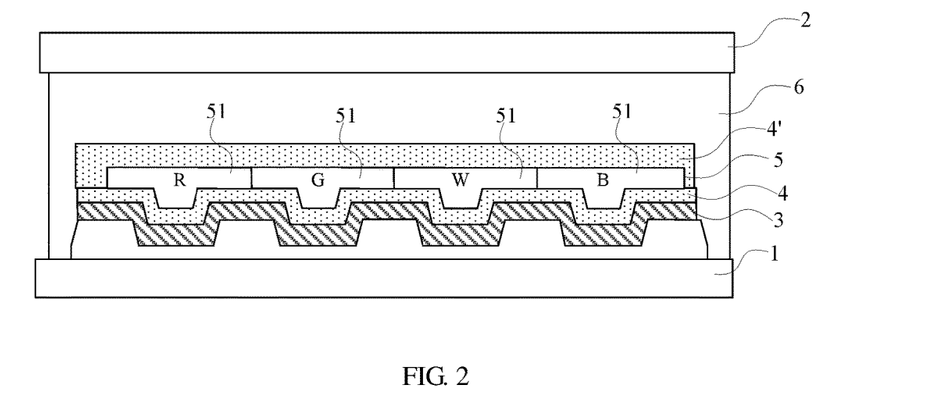
FIG. 2 is a structural schematic view illustrating an OLED display panel according to embodiments of the present disclosure.

Embodiments of the present disclosure provide an OLED display panel. FIG. 2 is a structural schematic view illustrating the OLED display panel according to the embodiments of the present disclosure. As shown in FIG. 2, the OLED display panel comprises: an array substrate 1 and a package cover plate 2 disposed opposite to each other, and an OLED layer 3 which is formed on a surface of the array substrate 1 facing the package cover plate 2. The OLED display panel further comprises: a first thin film packaging layer 4, covering the OLED layer 3 and bonded to the array substrate 1; a color filter layer 5, provided on a side of the first thin film packaging layer 4 facing the package cover plate 2; and a bonding adhesive 6, filled between the array substrate 1 and the package cover plate 2 to bond the array substrate and the package cover plate, the bonding adhesive 6 covering the color filter layer 5 and the first thin film packaging layer 4.

In the OLED display panel according to the embodiments, the first thin film packaging layer 4 covering the OLED layer 3 and bonded to the array substrate 1 is provided, the color filter layer 5 is formed on the surface of the first thin film packaging layer 4 facing the package cover plate 2, and the bonding adhesive 6 is provided on the side of the color filter layer 5 away from the OLED layer 3. Thus, only the first thin film packaging layer 4 is provided between the OLED layer 3 and the color filter layer 5, the distance between the OLED layer 3 and the color filter layer 5 is the thickness of the first thin film packaging layer 4, and the thickness of the thin film packaging layer is much less than the thickness of the bonding adhesive. Accordingly, in the OLED display panel according to the embodiments, the distance between the OLED layer 3 and the color filter layer 5 is relatively small so that light emitted from a light-emitting region of the OLED layer 3 corresponding to a sub pixel unit is prevented from irradiating on portions of the color filter layer 5 corresponding to other sub pixel units and the color mixture is prevented, thus the color aberration under large viewing angle in the OLED display panel is alleviated, the viewing angle of the OLED display panel is enlarged and the display effect is improved.

In addition, referring to FIG. 1, the conventional WOLED layer 01 comprises an anode 011 and a cathode 012 disposed opposite to each other, and an electroluminescent layer 013 made of an organic material and disposed between the anode 011 and the cathode 012. The organic material for forming the electroluminescent layer 013 and an active metal for forming the cathode 012 are both extremely sensitive to water vapor and easy to be eroded by the water vapor. In the prior art, further referring to FIG. 1, the transparent adhesive 05 is provided between the WOLED layer 01 and the color filter layer 03 and the transparent adhesive 05 is in contact with the cathode 012 of the WOLED layer 01, so waterproof capability of the OLED display panel formed by bonding the package cover plate 04 and the array substrate 02 mainly relies on a watertightness of the transparent adhesive 05. However, generally the watertightness of the transparent adhesive 05 is limited, the water vapor easily penetrates into the transparent adhesive 05 and get contact with the cathode 012 and the electroluminescent layer 013 of the WOLED layer 01, such that the cathode 012 and the electroluminescent layer 013 are eroded by the water vapor and the reliability of the OLED display panel is reduced.

In the OLED display panel according to the embodiments, the OLED layer 3 is covered by the first thin film packaging layer 4 and the first thin film packaging layer 4 is bonded to the array substrate 1 such that the OLED layer 3 is packaged within the array substrate 1, and then the bonding adhesive 6 covering the color filter layer 5 and the thin film packaging layer 4 is employed to bond the array substrate 1 and the package cover plate 2. Thus, in the OLED display panel formed by bonding the array substrate 1 and the package cover plate 2, the bonding adhesive 6 is used as a first waterproof layer to isolate most of the water vapor in the external environment from the OLED layer 3 so as to protect the OLED layer 3; the first film packaging layer 4 isolates the OLED layer 3 from the bonding adhesive 6 and is used as a second waterproof layer to prevent the water vapor penetrating into the bonding adhesive 6 from getting contact with the OLED layer 3, so that the cathode and electroluminescent layer of the OLED layer 3 is further protected from being eroded by the water vapor and the reliability of the OLED display panel is improved.

For example, the OLED display panel according to the embodiments of the present disclosure further comprises a second thin film packaging layer 4', and the second thin film packaging layer 4' is disposed between the bonding adhesive 6 and the color filter layer 5. In this way, two thin film packaging layers are provided between the OLED layer 3 and the bonding adhesive 6, so that the waterproof capability of the OLED display panel is further improved.

For example, the first thin film packaging layer 4 and the second thin film packaging layer 4' are seamlessly connected with each other to form an integral thin film packaging layer to further improve the waterproof capability. Meanwhile, after the first thin film packaging layer 4 and the second thin film packaging layer 4' are seamlessly connected with each other, the color filter layer 5 is packaged between the two thin film packaging layers, so that the water vapor penetrating into the bonding adhesive 6 is prevented from eroding the color filter layer 5.

Still referring to FIG. 2, for example, the color filter layer 5 comprises a plurality of monochromatic color filter units 51 corresponding to sub-pixel units of the display panel one by one.

For example, the first thin film packaging layer 4 and the second thin film packaging layer 4' are thin film packaging layers made of silicon nitride (SiNx), silicon oxide (SiOx) or silicon oxynitride (SiOxNy). The thin film packaging layers made of SiNx, SiOx or SiOxNy have good waterproof capabilities, which are helpful to improve the waterproof capability of the OLED display panel.

For example, the first thin film packaging layer 4 is of a single-layer structure or a multilayer structure. For example, the second thin film packaging layer 4' is of a single-layer structure or a multilayer structure.

It should be noted that, the first thin film packaging layer 4 and the second thin film packaging layer 4' described above may be made from other transparent inorganic materials instead of the above described materials as long as the transparent inorganic materials have a good waterproof capacity, and the details of the transparent inorganic materials will not be repeated here.

It should be noted that, the first thin film packaging layer 4 and the second thin film packaging layer 4' may be made from a same material or different materials.

For example, the bonding adhesive 6 is a dam adhesive, a filling adhesive, a face sealing, an optically clear adhesive (OCA) or an optically clear resin (OCR); but the bonding adhesive 6 is not limited to the above-described adhesives, and other transparent organic adhesives are also available, which will not be repeated in detail here. For example, the bonding adhesive 6 is disposed in a way of dam filling packaging or surface packaging.

Referring to FIG. 2, for example, the OLED layer 3 is a WOLED layer having a plurality of white organic light emitting diodes (WOLEDs); any two adjacent color filter units 51 in the color filter layer 5 are different in color, and each monochromatic color filter unit 51 corresponds to one white organic light emitting diode (WOLED) of the WOLED layer.

The OLED display panel, in which the color filter layer 5 is overlapped on the WOLED layer, does not need a masking process by using a high-precision metal mask, and thus the fabrication of the array substrate 1 and the WOLED layer is relatively simple.

Figure 3:
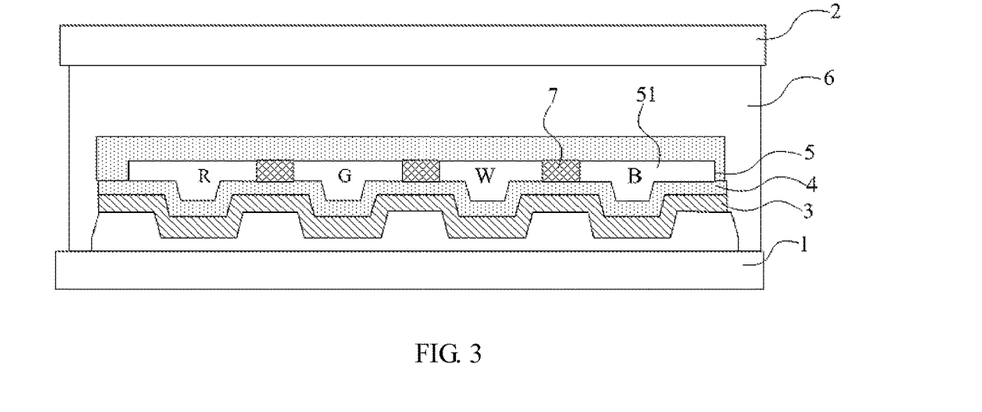
FIG. 3 is a structural schematic view illustrating an OLED display panel provided with a black matrix according to the embodiments of the present disclosure.

For example, the monochromatic color filter units 51 in the color filter layer 5 of the OLED display panel according to the embodiments of the present disclosure are disposed in three modes as follows:

Mode I: referring to FIG. 2 and FIG. 3, the plurality of monochromatic color filter units 51 in the color filter layer 5 comprise a red color filter unit R, a green color filter unit G, a white color filter unit W and a blue color filter unit B, and surfaces of the plurality of monochromatic color filter units 51 in the color filter layer 5 away from the array substrate 1 are provided in a same plane, which is helpful to reduce the thickness of the OLED display panel. Moreover, the color filter layer 5 has the white color filter unit W in addition to the red color filter unit R, the green color filter unit G and the blue color filter unit B, which facilitates to enhance the brightness of the OLED display panel and thereby to improve the display effect.

In the Mode I, one red color filter unit R, one green color filter unit G, one white color filter unit W and one blue color filter unit B form a pixel unit. In a same pixel unit, as shown in FIG. 2, any two adjacent monochromatic color filter units 51 are in contact with each other; or as shown in FIG. 3, a black matrix 7 is disposed between any two adjacent monochromatic color filter units 51.

The black matrix 7 is disposed between the adjacent monochromatic color filter units to block light emitted from the light-emitting region of the WOLED layer corresponding to the monochromatic filter unit 51 from irradiating to the sides of the monochromatic filter unit 51, so that the light emitted from the light-emitting region of the WOLED layer corresponding to the monochromatic filter unit 51 is prevented from irradiating to other monochromatic color filter units 51. Thus, the color aberration under large viewing angle in the OLED display panel is further alleviated, and the display effect of the OLED display panel is further improved.

Figure 4:
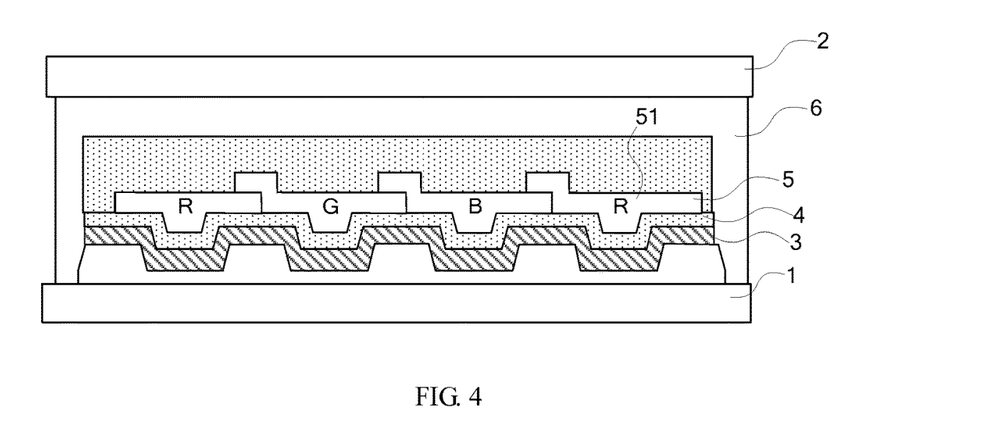
FIG. 4 is a structural schematic view illustrating an OLED display panel in which any two adjacent monochromatic color filter units are partially overlapped with each other according to the embodiments of the present disclosure.

Mode II: referring to FIG. 4, the plurality of monochromatic color filter units 51 in the color filter layer 5 comprise the red color filter unit R, the green color filter unit G and the blue color filter unit B, and any two adjacent monochromatic color filter units 51 in a same pixel unit are in contact with each other and are partially overlapped with each other.

One red color filter unit R, one green color filter unit G and one blue color filter unit B form a pixel unit. In the same pixel unit, an overlapping region is provided between adjacent monochromatic color filter units 51 of different colors, the overlapping region blocks a white light beam emitted from the light-emitting region of the WOLED layer corresponding to the monochromatic filter unit 51 of one color from irradiating to the monochromatic filter unit 51 of the other color, thereby the color aberration is prevented. For example, as shown in FIG. 4, taking the red color filter unit R and green color filter unit G adjacent to each other as an example, a partial region of an edge of the green color filter unit G overlaps on a surface of the red color filter unit R away from the array substrate 1. As for the white light emitted from the light-emitting region of the WOLED layer corresponding to the red color filter unit R, the white light can pass through the red color filter unit R to obtain red light; and when part of the red light near the green color filter unit G irradiates to the green color filter unit G overlapping on the red color filter unit R, the part of the red light will be blocked by the green color filter unit G and cannot pass through green color filter unit G. Accordingly, the color mixture between the sub-pixel unit corresponding to the red color filter unit R and the sub-pixel unit corresponding to the green color filter unit G is prevented, and thus the color aberration under large viewing angle in the OLED display panel is alleviated, and the display effect of the OLED display panel is further improved.

Figure 5:
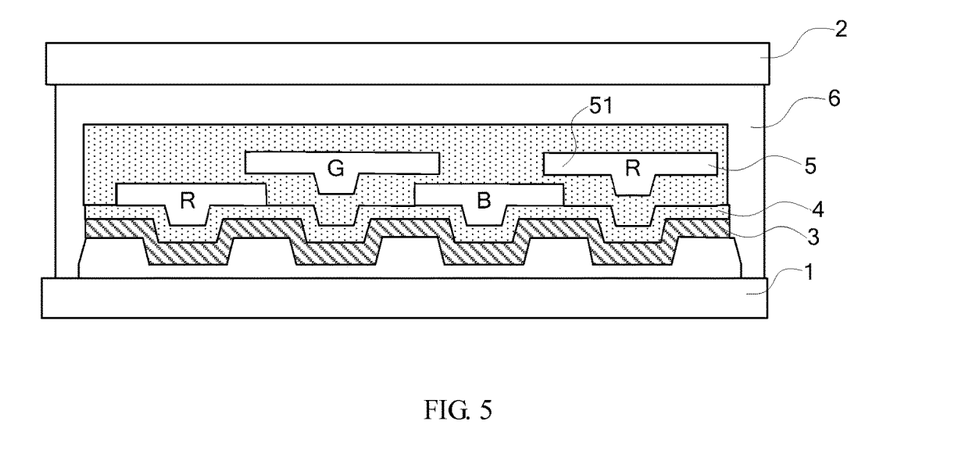
FIG. 5 a structural schematic view illustrating an OLED display panel in which any two adjacent monochromatic color filter units are not in contact with each other according to the embodiments of the present disclosure.

Mode III: referring to FIG. 5, the plurality of monochromatic color filter units 51 in the color filter layer 5 comprises the red color filter unit R, the green color filter unit G and the blue color filter unit B, the monochromatic color filter units 51 in a same pixel unit are not in contact with each other, and projections of any two adjacent monochromatic color filter units 51 on the array substrate have an overlapping region.

One red color filter unit R, one green color filter unit G and one blue color filter unit B form a pixel unit. In the same pixel unit, the projections of any two adjacent monochromatic color filter units 51 of different colors on the array substrate 1 have the overlapping region; after light emitted from the light-emitting region of the WOLED layer passes through an edge of the monochromatic filter unit 51 of one color which is closer to the array substrate, a monochromatic light which has the same color as the monochromatic filter unit 51 closer to the array substrate is obtained, and the obtained monochromatic light continues to propagate along a straight line to the monochromatic filter unit 51 of the other color and then blocked by the monochromatic filter unit 51 of the other color, thereby the color aberration is prevented. For example, as shown in FIG. 5, taking the red color filter unit R and the green color filter unit G adjacent to each other as an example, there is an overlapping region between the projection of the green color filter unit G on the array substrate 1 and the projection of the red color filter unit R on the array substrate 1. As for the white light emitted from the light-emitting region of the WOLED layer corresponding to the red color filter unit R, the white light passes through the red color filter unit R to obtain red light, a part of the red light near the green color filter unit G continues to propagate along a straight line to the green color filter unit G, and the part of the red light will be blocked by the green color filter unit G and cannot pass through the green color filter unit G. Accordingly, the color mixture between the sub-pixel unit corresponding to the red color filter unit R and the sub-pixel unit corresponding to the green color filter unit G is prevented, and thus the color aberration under large viewing angle in the OLED display panel is alleviated, and the display effect of the OLED display panel is further improved.

Still referring to FIG. 5, in the Mode III, for example, among the plurality of monochromatic color filter units 51 of the same pixel unit, a surface of each monochromatic filter unit 51 facing the array substrate 1 and a surface of its adjacent monochromatic filter unit 51 facing the array substrate 1 are not provided in a same plane. As shown in FIG. 5, a surface of the green color filter unit G facing the array substrate 1 is not provided in a same plane as a surface of its adjacent blue color filter unit B facing the array substrate 1, and is not provided in a surface of its adjacent red color filter unit R facing the array substrate 1. Thus, in a case where the plurality of monochromatic color filter units 51 are not in contact with one another, the projections of any two adjacent monochromatic color filter units 51 on the array substrate 1 have the overlapping region.

Embodiments of the present disclosure further provide a display device, and the display device comprises the above-described OLED display panel.

In the OLED display panel according to the embodiments, the distance between the OLED layer 3 and the color filter layer 5 is relatively small so that light emitted from a light-emitting region of the OLED layer 3 corresponding to a sub pixel unit is prevented from irradiating on portions of the color filter layer 5 corresponding to other sub pixel units and the color mixture is prevented, thus the color aberration under large viewing angle in the OLED display panel is alleviated. Thus, in the display device having the above described OLED display panel according to the embodiments of the present disclosure, the color aberration under large viewing angle in the OLED display panel is effectively alleviated, so that the viewing angle of the display device according to the embodiments of the present disclosure is enlarged and the display effect is improved.

Embodiments of the present disclosure further provide a fabrication method of an OLED display panel. The method comprises:

Step S601: forming an OLED layer comprising a plurality of organic light emitting diodes (OLEDs) on the array substrate;

Step S602: forming a first thin film packaging layer on the OLED layer;

Step S603: forming a color filter layer on the first thin film packaging layer;

Step S604: filling a bonding adhesive;

Step S605: bonding a package cover plate to the bonding adhesive.

Similar to the advantages of the OLED display panel described above, in the OLED display panel formed by the fabrication method according to the embodiments of the present disclosure, the distance between the OLED layer and the color filter layer is relatively small so that light emitted from a light-emitting region of the OLED layer corresponding to a sub pixel unit is prevented from irradiating on portions of the color filter layer corresponding to other sub pixel units and the color mixture is prevented, thus the color aberration under large viewing angle in the OLED display panel is alleviated.

For example, in step S603, the color filter comprises a plurality of monochromatic color filter units corresponding to sub-pixel units of the display panel one by one, and a plurality monochromatic color filter units are coated on the thin film packaging layer for example by thermal evaporation, interference filter coating or laser transfer coating.

Of course, the coating for the monochromatic color filter units in the color filter layer is not limited to the above described coating methods, and other coating methods are also available, which will not be repeated in detail here.

The foregoing embodiments merely are exemplary embodiments of the disclosure, and not intended to define the scope of the disclosure, and the scope of the disclosure is determined by the appended claims.

The present application claims priority of Chinese Patent Application No. 201410196115.2 filed on May 9, 2014, the disclosure of which is incorporated herein by reference in its entirety as part of the present application.

What is claimed is:

1. An organic light emitting diode (OLED) display panel, comprising:
    an array substrate and a package cover plate disposed opposite to each other;
    an OLED layer which is formed on a surface of the array substrate facing the package cover plate and comprises a plurality of OLEDs;
    a first thin film packaging layer, covering the OLED layer and bonded to the array substrate;
    a color filter layer, provided on a side of the first thin film packaging layer facing the package cover plate; and
    a bonding adhesive, filled between the array substrate and the package cover plate to bond the array substrate and the package cover plate, the bonding adhesive covering the color filter layer and the first thin film packaging layer,
    wherein the color filter layer directly contacts the first thin film packaging layer, and the OLED layer directly contacts the first thin film packaging layer.

2. The OLED display panel according to claim 1, further comprising: a second thin film packaging layer which is provided between the bonding adhesive and the color filter layer.

3. The OLED display panel according to claim 1, wherein the color filter layer comprises a plurality of monochromatic color filter units corresponding to sub-pixel units of the display panel one by one.

4. The OLED display panel according to claim 3, wherein the OLED layer is a white organic light emitting diode (WOLED) layer comprising a plurality of WOLEDs; and
any two adjacent monochromatic color filter units in the color filter layer are different in color.

5. The OLED display panel according to claim 4, wherein the plurality of monochromatic color filter units in the color filter layer comprises a red color filter unit R, a green color filter unit G, a white color filter unit W, and a blue color filter unit B; and
surfaces of the plurality of monochromatic color filter units in the color filter layer away from the array substrate are provided in a same plane.

6. The OLED display panel according to claim 5, wherein one red color filter unit R, one green color filter unit G, one white color filter unit W, and one blue color filter unit B form a pixel unit; and
in a same pixel unit, any two adjacent monochromatic color filter units are in contact with each other or a black matrix is disposed between any two adjacent monochromatic color filter units.

7. The OLED display panel according to claim 4, wherein the plurality of monochromatic color filter units in the color filter layer comprises a red color filter unit R, a green color filter unit G, and a blue color filter unit B;
one red color filter unit R, one green color filter unit G, and one blue color filter unit B form a pixel unit; and
any two adjacent monochromatic color filter units in a same pixel unit are in contact with each other and are partially overlapped with each other.

8. The OLED display panel according to claim 4, wherein the plurality of monochromatic color filter units in the color filter layer comprises a red color filter unit R, a green color filter unit G, and a blue color filter unit B;
one red color filter unit R, one green color filter unit G, and one blue color filter unit B form a pixel unit; and
the monochromatic color filter units in a same pixel unit are not in contact with each other, and projections of any two adjacent monochromatic color filter units on the array substrate have an overlapping region.

9. The OLED display panel according to claim 8, wherein among the plurality of monochromatic color filter units of the same pixel unit, a surface of each monochromatic filter unit facing the array substrate and a surface of its adjacent monochromatic filter unit facing the array substrate are not provided in a same plane.

10. The OLED display panel according to claim 2, wherein the first thin film packaging layer and the second thin film packaging layer are seamlessly connected with each other to form an integral thin film packaging layer.

11. The OLED display panel according to claim 2, wherein the first thin film packaging layer and the second thin film packaging layer are made of silicon nitride, silicon oxide or silicon oxynitride.

12. The OLED display panel according to claim 1, wherein the bonding adhesive is a dam adhesive, a filling adhesive, a face sealing, an optically clear adhesive (OCA) or an optically clear resin (OCR).

13. The OLED display panel according to claim 1, wherein the first thin film packaging layer is of a single-layer structure or a multilayer structure.

14. The OLED display panel according to claim 2, wherein the second thin film packaging layer is of a single-layer structure or a multilayer structure.

15. A display device, comprising an OLED display panel according to claim 1.

16. A fabrication method of the OLED display panel of claim 1, comprising:
forming the OLED layer having the plurality of (OLEDs) on the array substrate;
forming the first thin film packaging layer on the OLED layer;
forming the color filter layer on the first thin film packaging layer;
filling a bonding adhesive; and
bonding the package cover plate to the bonding adhesive.

17. The fabrication method according to claim 16, wherein the color filter layer comprises a plurality of monochromatic color filter units corresponding to sub-pixel units of the display panel one by one, and the plurality of the monochromatic color filter units are formed on the first thin film packaging layer by thermal evaporation, interference filter coating or laser transfer coating.

18. An organic light emitting diode (OLED) display panel, comprising:
an array substrate and a package cover plate disposed opposite to each other;
an OLED layer which is formed on a surface of the array substrate facing the package cover plate and comprises a plurality of OLEDs;
a first thin film packaging layer, covering the OLED layer and bonded to the array substrate;
a color filter layer, provided on a side of the first thin film packaging layer facing the package cover plate; and
a bonding adhesive, filled between the array substrate and the package cover plate to bond the array substrate and the package cover plate, the bonding adhesive covering the color filter layer and the first thin film packaging layer,
wherein a plurality of monochromatic color filter units in the color filter layer comprises a red color filter unit R, a green color filter unit G and a blue color filter unit B; one red color filter unit R, one green color filter unit G, and one blue color filter unit B form a pixel unit; and the monochromatic color filter units in a same pixel unit are not in contact with each other, and projections of any two adjacent monochromatic color filter units on the array substrate have an overlapping region.

19. An organic light emitting diode (OLED) display panel, comprising:
an array substrate and a package cover plate disposed opposite to each other;
an OLED layer which is formed on a surface of the array substrate facing the package cover plate and comprises a plurality of OLEDs;
a first thin film packaging layer, covering the OLED layer and bonded to the array substrate;
a color filter layer, provided on a side of the first thin film packaging layer facing the package cover plate; and
a bonding adhesive, filled between the array substrate and the package cover plate to bond the array substrate and the package cover plate, the bonding adhesive covering the color filter layer and the first thin film packaging layer, wherein the OLED display panel further comprises: a second thin film packaging layer which is provided between the bonding adhesive and the color filter layer, and wherein the first thin film packaging layer and the second thin film packaging layer are seamlessly connected with each other to form an integral thin film packaging layer.

\* \* \* \* \*